United States Patent
Öhngren et al.

(10) Patent No.: US 8,206,658 B2
(45) Date of Patent: Jun. 26, 2012

(54) TUBE AND USE OF SAID TUBE

(75) Inventors: Claes Öhngren, Uppsala (SE); Bo Jönsson, Västerås (SE)

(73) Assignee: Sandvik Intellectual Property AB, Sandviken (SE)

( * ) Notice: Subject to any disclaimer, the term of this patent is extended or adjusted under 35 U.S.C. 154(b) by 860 days.

(21) Appl. No.: 12/095,253

(22) PCT Filed: Nov. 15, 2006

(86) PCT No.: PCT/SE2006/050475
§ 371 (c)(1),
(2), (4) Date: Nov. 17, 2008

(87) PCT Pub. No.: WO2007/064288
PCT Pub. Date: Jun. 7, 2007

(65) Prior Publication Data
US 2009/0074635 A1    Mar. 19, 2009

(30) Foreign Application Priority Data
Dec. 2, 2005   (SE) ...................... 0502645

(51) Int. Cl.
*B01J 19/00*   (2006.01)
*F28D 7/00*    (2006.01)
*C10G 9/12*    (2006.01)

(52) U.S. Cl. ........ 422/240; 422/200; 422/310; 422/659; 165/133; 165/134.1; 208/48 R

(58) Field of Classification Search .............. 422/200, 422/240, 310, 659; 165/133, 134.1; 208/48 R
See application file for complete search history.

(56) References Cited

U.S. PATENT DOCUMENTS
5,986,244 A    11/1999  Jonsson et al.
2005/0019202 A1*  1/2005  Lundberg et al. ............... 420/63

FOREIGN PATENT DOCUMENTS
JP   2003139273   5/2003
SE      524010    6/2004
WO   WO 2004/104257  12/2004

OTHER PUBLICATIONS

Extended European Search Report for 06824544.8, dated Jul. 5, 2011.
Notice of Reasons for Rejection against JP2008-543238, dated Dec. 13, 2011.

* cited by examiner

*Primary Examiner* — Walter D Griffin
*Assistant Examiner* — Lessanework Seifu
(74) *Attorney, Agent, or Firm* — Morgan, Lewis & Bockius LLP

(57) ABSTRACT

A metallic tube for heating a medium or subject outside thereof or inside it by transfer of heat energy through walls of the tube, in which heat is absorbed or emitted at least to a substantial degree by radiation on one or both of the inner and outer surfaces of the tube, is of a material forming a layer of essentially $Al_2O_3$ on the surfaces thereof when heated to at least approximately 750° C. At least one of the external and the internal surface of the tube is coated by one of a metal, metal alloy and metal compound, which after oxidation forms a layer having an emissivity coefficient exceeding 0.7, or by a layer essentially consisting of a metal oxide which has an emissivity coefficient exceeding 0.7.

20 Claims, No Drawings

TUBE AND USE OF SAID TUBE

The present invention relates to a metallic tube for heating a medium or subject outside thereof or inside it by transfer of heat energy through walls of the tube, in which heat is absorbed or emitted at least to a substantial degree by radiation on one or both of the inner and outer surfaces of the tube, said tube being of a material forming a layer of essentially $Al_2O_3$ on the surfaces thereof when heated to at least approximately 750° C.

Such a tube may be used for all types of radiation heating taking place for example in a carburizing environment, i.e. an environment where carbonized coal (coke) may be produced. This particular use of such a tube will be discussed hereinafter. Finned tubes as well as smooth tubes are comprised.

A tube of this type is known from SE C2 524 010 for use in a cracking furnace in which gaseous hydrocarbons flowing in the tube are cracked into ethene, $H_2C=H_2C$, which is used as raw material within the plastics industry. This particular application of a tube of this type will hereinafter be described for illuminating the invention but not in any way restricting the scope of the invention thereto.

Such a radiation heating tube, also known as cracker tube, is in the cracking furnace heated by surrounding burners to a temperature being sufficiently high for forming ethene inside the tube, which may be a temperature in the region of 1100° C. An advantage of using a tube of this base material is that a thin layer of essentially alumina, $Al_2O_3$, is formed on the external and internal surface of the tube when said base material reaches a temperature of approximately 750° C. to 950° C. This thin alumina layer prevents Fe of the base material from coming into contact with the gas flowing inside tube, which is important since Fe acts as a catalyst for forming carbonized coal on the surface of the tube by so called catalytic carburization. Furthermore, pyrolytic carburization may appear in the gas flow. However the catalytic carburization is the major problem. In such tubes made of other commonly used materials, such as Alloy 800 HT, not providing an alumina layer of this type carbonized coal has been produced inside the tube and been deposited on the internal wall of the tube reducing the gas flow in the tube and the heat transfer from the tube to the gas flowing therein. There was in such tubes of said other commonly used materials also a risk of a complete obstruction of the tube by carbonized coal. Although known tubes of the type defined in the introduction are advantageous with respect to said conventional tubes there is an ongoing attempt to provide tubes of the type described in SE C2 524 010 with improved features.

The object of the present invention is to provide a tube of the type defined in the introduction which will improve the efficiency of a cracking furnace. This object is according to the invention obtained by providing an alumina forming tube in which at least one of the external and the internal surface of the tube is coated by one of a metal, metal alloy and metal compound, which after oxidation forms a layer having an emissivity coefficient exceeding 0.7, or by a layer consisting essentially of a metal oxide which has an emissivity coefficient exceeding 0.7.

By providing at least one of the external and the internal surface of the tube with a said surface coating layer with an emissivity coefficient exceeding 0.7, i.e. being higher than the emissivity coefficient of $Al_2O_3$, which is 0.7, a tube having an increased emissivity where said surface coating layer is applied with respect to a tube having an outer layer of $Al_2O_3$ will be obtained. $Al_2O_3$ will when using the tube for the intended purpose, e.g. radiation heating in for example a carburizing environment, be present under said surface coating layer, so that the formation of carbonized coal is still prevented from occurring. This means that it is not necessary to carry out degazing operations for removing carbonized coal from the tube as often as compared to for example Alloy 800 HT mentioned above. This higher emissivity coefficient results in an increased efficiency of the radiation heating through such a tube, since less power will be needed to obtain a certain heating effect. In the application described above of the tube for cracking gaseous hydrocarbons this means that less power is needed for heating a gas mixture flowing at a predetermined flow rate through the tube to a predetermined temperature, so that power may be saved or the gas flow rate may be increased for a predetermined power while still obtaining heating of the gas mixture to a predetermined temperature. This means that it is possible to obtain a higher efficiency of the cracking furnace as a whole. A bonus effect of the increased emissivity coefficient is a prolonged life of such a tube according to the invention with respect to radiation heating tubes already known.

According to the theory of heat transfer by radiation said emissivity coefficient may assume a value between 0 and 1 and varies for ordinary materials from values which are as low as 0.05 for a bright metal surface, up to 0.9 for certain materials which also have an appropriate surface roughness.

The layer of $Al_2O_3$ to be present on the surface of the tube when using the tube for radiation heating in a carburizing environment will be formed either when manufacturing the tube, when such manufacturing involves heating of the base material to a sufficiently high temperature, or later on when the tube is heated during the intended use thereof. It has been found that a non-oxidized surface of said FeCrAl base material will form an $Al_2O_3$ layer upon heating to the relevant temperature even if said surface is coated by a said surface coating layer. The $Al_2O_3$ layer may besides the feature of preventing production of carbonized coal also improve the adherence of the outermost surface layer and the base material part (substrate) of the tube. The material used for said surface coating layer should preferably have a low solubility in $Al_2O_3$, so that it may not change the properties of the $Al_2O_3$ layer.

According to an embodiment of the invention said surface coating layer is designed to provide a said emissivity coefficient exceeding 0.8, which will result in a substantial efficiency increase with respect to the case of such a tube having no surface coating layer of this type and accordingly an emissivity coefficient of 0.7.

According to another embodiment of the invention only one, first of said external and internal surface of the tube is coated by said surface coating layer for allowing the other, second of said external and internal surface of the tube to be in contact with a gas atmosphere for which any risk of undesired substances coming from said coating layer into this gas atmosphere has to be avoided. The efficiency increase of said radiation heating will be the best if both the external and the internal surface of the tube is coated by said surface coating layer, but in the case of a requirement to avoid any risk of undesired substances coming from the coating layer into the gas atmosphere outside or inside the tube it may be refrained from coating one of said surfaces. For instance in the above case of a use in a cracking furnace it may be chosen to only provide the external surface of the tube with said surface coating layer for avoiding any risk of introduction of substances from this layer into the process gas flowing inside the tube, since such substances may disturb the process steps downstream of the furnace.

According to another embodiment of the invention said surface coating layer consists of a metal or metal alloy spontaneously forming said metal oxide at the intended operating temperature and/or environment of the tube for radiation heating. This constitutes a suitable way of obtaining said increased emissivity coefficient. This includes such spontaneous forming at the operating temperature for radiation heating as well as at lower temperatures during the phase of heating the tube to rise to said operating temperature.

According to another embodiment of the invention, the metal, the metal alloy or the metal oxide of said surface coating layer is nickel or cobalt, an alloy containing nickel and/or cobalt or a metal oxide containing nickel and/or cobalt.

It has been shown that cobalt oxide has only small if any effect upon the growth of $Al_2O_3$ for forming said $Al_2O_3$ layer at high temperatures. Furthermore, solubility of Co/CoO in $Al_2O_3$ is negligible, which means that a cobalt oxide layer, which is present on the surface at the start, is also located on the surface of the tube after long time and is reasonably unaffected. Even if a surface layer of a cobalt oxide is desirable, also a surface layer of metallical cobalt or other cobalt alloys could be applied, provided that it becomes oxidized when the tube reaches the operating temperature. The layer of Co may for example be applied to the tube by vacuum deposition. When using nickel for said surface coating layer the emissivity coefficient of the tube increases when the surface layer is oxidized to NiO. A Ni layer may for example be electrolytically applied to the tube.

According to another embodiment of the invention the tube has a FeCrAl base material containing 10-25 weight-% Cr, 1-10 weight-% Al, 0-5 weight-% Mo, a smaller amount alloying elements and balance Fe. This tube base material known from SE C2 524 010 has advantageous features with respect to the use for heat radiation. However, the invention is applicable to all types of tubes forming a layer of $Al_2O_3$ at high temperatures, namely 750° C.-950° C., such as S&C HT60 having NiCrAl Fe as base material.

According to another embodiment of the invention the content of Mo in said base material is 2-3.5 weight-%. The Mo content in said base material results in a higher resistance of this material, but the reason for keeping the molybdenum content comparatively low is that when the molybdenum content is too high a volatile molybdenum oxide $MoO_3$ could be formed, which evaporates and disappears, so that the bulk of the material is partly depleted of Mo and by that the resistance of the material is reduced. The molybdenum content results in a higher creep resistance and a correspondingly remarkable increase of the life of the tube.

According to another embodiment of the invention the base material of the tube contains smaller fractions of one or more of the alloying elements hafnium, zirconium, yttrium, nitrogen, carbon and oxygen, the total content of these alloying elements being max 5 weight-%, preferably max 3 weight-%. These alloying elements may give the base material of the tube features preferable from the creep and/or corrosion resistance point of view.

According to another embodiment of the invention the surface coating layer has a thickness >0.3 µm, preferably >0.5 µm. It has been found out that a thickness of said surface coating layer exceeding 0.3 µm is required for obtaining a noticeable increase of the emissivity coefficient of the tube surface, and it should be above 0.5 µm for obtaining the emissivity coefficient possible for the material used for said surface coating layer. It seems as if $Al_2O_3$ may be formed under such a surface coating layer independently of the thickness thereof, but it may of course not be too thick so that this is not possible when applying the surface coating layer before the $Al_2O_3$ layer is formed. This means that in such a case the thickness may as a precautionary measure be chosen to not exceed 5 µm.

The invention also relates to a tube system comprising a plurality of tubes according to the present invention. Such a tube system will have the above advantageous features when used for heating a medium or subject.

The invention also relates to a cracking furnace for cracking gaseous hydrocarbons, such as for forming ethene, which contains one tube for radiation heating according to the present invention. The function of a cracking furnace having such a tube and the advantages thereof appear from the disclosure above.

The invention also relates to a use of a tube according to the present invention in a carburizing atmosphere, where it may benefit from the alumina surface forming properties thereof.

The invention further relates to the use of a tube according to the present invention in a furnace for radiation heating of a medium inside said tube by receiving radiation heat on the external surface of said tube. In such a use the available power may be more efficiently utilized or power may be saved with respect to a tube having $Al_2O_3$ as the outer layer covering for example the external surface of the tube. The efficiency may then be even more increased when also the other, such as the internal surface of the tube is coated with said surface coating layer. Said medium is then preferably in the form of a gaseous medium inside the tube, although also solid materials or liquid mediums may be heated in this way. A particularly advantageous use of a tube according to the invention is in a cracking furnace for cracking hydrocarbons flowing through the tube, such as for forming ethene. However, it is pointed out that the invention also functions in other applications where this type of radiation heating takes place than in cracking furnaces.

Another possible use of a tube according to the invention is in a furnace for heating objects to be placed in the furnace by heating the tube from the inside for radiating heat into the surrounding of the tube. The heating of mostly cold objects placed in such a furnace for heat treatment thereof will be more efficient by using a tube having an increased emissivity coefficient of at least one of the external and internal surface thereof.

The invention is of course not in any way restricted to the embodiments described above, but many possibilities to modifications thereof would be apparent to a person with ordinary skill in the art without departing from the basic idea of the invention as defined in the appended claims.

The invention claimed is:

1. A metallic tube for heating a medium or subject outside thereof or inside it by transfer of heat energy through walls of the tube, in which heat is absorbed or emitted at least by radiation on one or both of the inner and outer surfaces of the tube, said tube being of a material forming a layer of essentially $Al_2O_3$ on the surfaces thereof when heated to at least approximately 750° C., wherein at least one of the external and the internal surface of the tube is coated by one of a metal, metal alloy and metal compound, which after oxidation forms a layer having an emissivity coefficient exceeding 0.7, or by a layer consisting essentially of a metal oxide which has an emissivity coefficient exceeding 0.7.

2. A tube according to claim 1, wherein said surface coating layer is designed to provide a said emissivity coefficient exceeding 0.8.

3. A tube according to claim 1, wherein only one, first of said external and internal surface of the tube is coated by said surface coating layer for allowing the other, second of said external and internal surface of the tube to be in contact with a gas atmosphere for which any risk of undesired substances coming from said coating layer into this gas atmosphere has to be avoided.

4. A tube according to claim 1, wherein said surface coating layer consists of a metal or metal alloy spontaneously forming said metal oxide at the intended operating temperature and/or environment of the tube for radiation heating.

5. A tube according to claim 1, wherein the metal, the metal alloy or the metal oxide of said surface coating layer is nickel or cobalt, an alloy containing nickel and/or cobalt or a metal oxide containing nickel and/or cobalt.

6. A tube according to claim 1, wherein the tube has a FeCrAl base material containing 10-25 weight-% Cr, 1-10 weight-% Al, 0-5 weight-% Mo, a smaller amount of alloying elements and balance Fe.

7. A tube according to claim 6, wherein the content of Mo in said base material is 2-3.5 weight-%.

8. A tube according to claim 6, wherein the base material of the tube contains smaller fractions of one or more of the alloying elements hafnium, zirconium, yttrium, nitrogen, carbon and oxygen, and that the total content of these alloying elements is max 5 weight-%.

9. A tube according to claim 1, wherein said surface coating layer has a thickness >0.3 μm.

10. A tube according to claim 1, wherein it is a cracker tube.

11. A tube system comprising a plurality of tubes according to claim 1.

12. A cracking furnace for cracking gaseous hydrocarbons, wherein it contains one tube according to claim 1.

13. A use of the tube according to claim 1 in a furnace, comprising radiation heating of a medium inside said tube by receiving radiation heat on the external surface of said tube.

14. A use according to claim 13, wherein the medium is in the form of a gaseous medium.

15. A use according to claim 14, in which the tube is arranged in a cracking furnace for cracking hydro carbons flowing through the tube.

16. A use of the tube according to claim 1 in a furnace, comprising heating the tube from the inside for radiating heat into the surrounding of the tube.

17. A tube according to claim 2, wherein only one, first of said external and internal surface of the tube is coated by said surface coating layer for allowing the other, second of said external and internal surface of the tube to be in contact with a gas atmosphere for which any risk of undesired substances coming from said coating layer into this gas atmosphere has to be avoided.

18. A tube according to claim 6, wherein the base material of the tube contains smaller fractions of one or more of the alloying elements hafnium, zirconium, yttrium, nitrogen, carbon and oxygen, and that the total content of these alloying elements is max 3 weight-%.

19. A tube according to claim 1, wherein said surface coating layer has a thickness >0.5 μm.

20. A use according to claim 16, comprising heating with the radiated heat an object placed in the furnace.

* * * * *